(12) United States Patent
Holloway et al.

(10) Patent No.: US 6,912,679 B1
(45) Date of Patent: Jun. 28, 2005

(54) SYSTEM AND METHOD FOR ELECTRICAL DATA LINK TESTING

(75) Inventors: Kenneth D. Holloway, San Jose, CA (US); Jeffery A. Benis, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/562,588

(22) Filed: Apr. 29, 2000

(51) Int. Cl.[7] .............................................. G01R 31/28
(52) U.S. Cl. ........................ 714/728; 714/715; 714/717; 375/224; 324/527
(58) Field of Search ............................ 714/1, 728, 715, 714/716–717, 712, 818, 815, 252, 7, 26, 48; 711/232; 709/232; 370/241, 248–250, 251, 514; 375/224; 324/527–528

(56) References Cited

U.S. PATENT DOCUMENTS 6,169,763 B1 * 1/2001 Woodward et al. ......... 375/224
6,381,269 B1 * 4/2002 Gradl et al. ................ 375/224

OTHER PUBLICATIONS

Floyd et al. "Real–time on–board bus testing; IEEE Proceedings VLSI Test Symposium; Page(s): 140–145; Apr. 30–May 3, 1995".*

Floyd et al. << Real–time on–board bus testing; IEEE Proceedings VLSI Test Symposium; Page(s): 140–145; Apr. 30–May 3, 1995.*

* cited by examiner

*Primary Examiner*—Guy J. Lamarre

(57) ABSTRACT

A system and method provides for direct control of a high speed data link in a computer system for purposes of testing the data link under a full range of anticipated operating conditions. The transmission of test data is preferably under hardware control and preferably does not encounter interference from other data sources in the computer system thereby enabling the intended test pattern data to be experienced by the data link under test in unaltered form. The tested data is preferably compared to the original data in order to evaluate the status of the link under test.

20 Claims, 5 Drawing Sheets

SYSTEM AND METHOD FOR ELECTRICAL DATA LINK TESTING

TECHNICAL FIELD

The invention relates in general to electrical testing of computer systems and in particular to testing of high speed data links in computer systems.

BACKGROUND

When designing and maintaining large computing systems it is generally desirable to evaluate the links between integrated chips located at different points within the system to ensure that data transmission between such chips is not disrupted during normal operation. In particular, links carrying data at high transmission rates should be examined for pattern sensitivity since such sensitivity could be particularly disruptive to high frequency data transmissions. Pattern sensitivity may arise, for example, when the data abruptly changes from a sequence of logical ones to a sequence of logical zeros because of sudden changes in local voltage levels.

Prior art approaches to testing links have generally involved executing programs on a CPU (central processing unit) or other computing entity, driving a data sequence over the link and then testing the accuracy of the data received at the other end of the link. Employing software executed on CPUs to generate data patterns for transmission across a link experiences certain limitations which are discussed below.

FIG. 1 depicts a block diagram 100 representing an approach to testing a data link according to a prior art solution. It may be seen that test data emerging from CPU 101 is generally lined up in queues 104 along with data from memory 102 and I/O (input/output system) 103. In this situation, test data may end up being interspersed with data from the other devices, thereby possibly preventing transmission of a continuous test data pattern from CPU 101 as originally configured. While the test data may generally be separated from the other data after transmission over high speed link 106 at the other end of the link, the mixing of data from diverse sources may prevent proper testing of the link employing the characteristics of the data pattern. The lack of direct control of the contents of data transmission over the high speed link 106 during transmission of test data from CPU 101 is one factor preventing the link from being tested in an optimal manner. The mixing of data from the diverse sources may operate to prevent transmission of data patterns, particularly data patterns which most fully exercise the link in extreme circumstances.

Accordingly, it is a problem in the art that test data may be combined with data from non-testing data sources, thereby compromising the integrity of the sequence of data values in a selected test pattern.

It is a further problem in the art that the source of test data is not able to fully control the link during transmission of test data.

SUMMARY OF THE INVENTION

These and other objects, features and technical advantages are achieved by a system and method which employs hardware disposed at a link interface to directly control the transmission of test data patterns over a high speed link without interference from other sources of data, thereby preserving test data patterns intact for transmission across the link. In this manner, the link may be tested under the most severe conditions without experiencing disruption of test pattern data caused by various data producing components in the computer system. The equipment controlling the communication across the link during the test preferably operates completely independently of the CPU or other device.

Accordingly, it is an advantage of a preferred embodiment of the present invention that testing equipment is provided with direct control rather than indirect control over the link during transmission of test data.

It is a further advantage of a preferred embodiment of the present invention that no intervening components or circuitry may operate to disrupt a sensitive data sequence within a test pattern.

It is a still further advantage of a preferred embodiment of the present invention that the inventive system and method will more fully exercise potential defects in the link than did systems of the prior art.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

Figure 1:
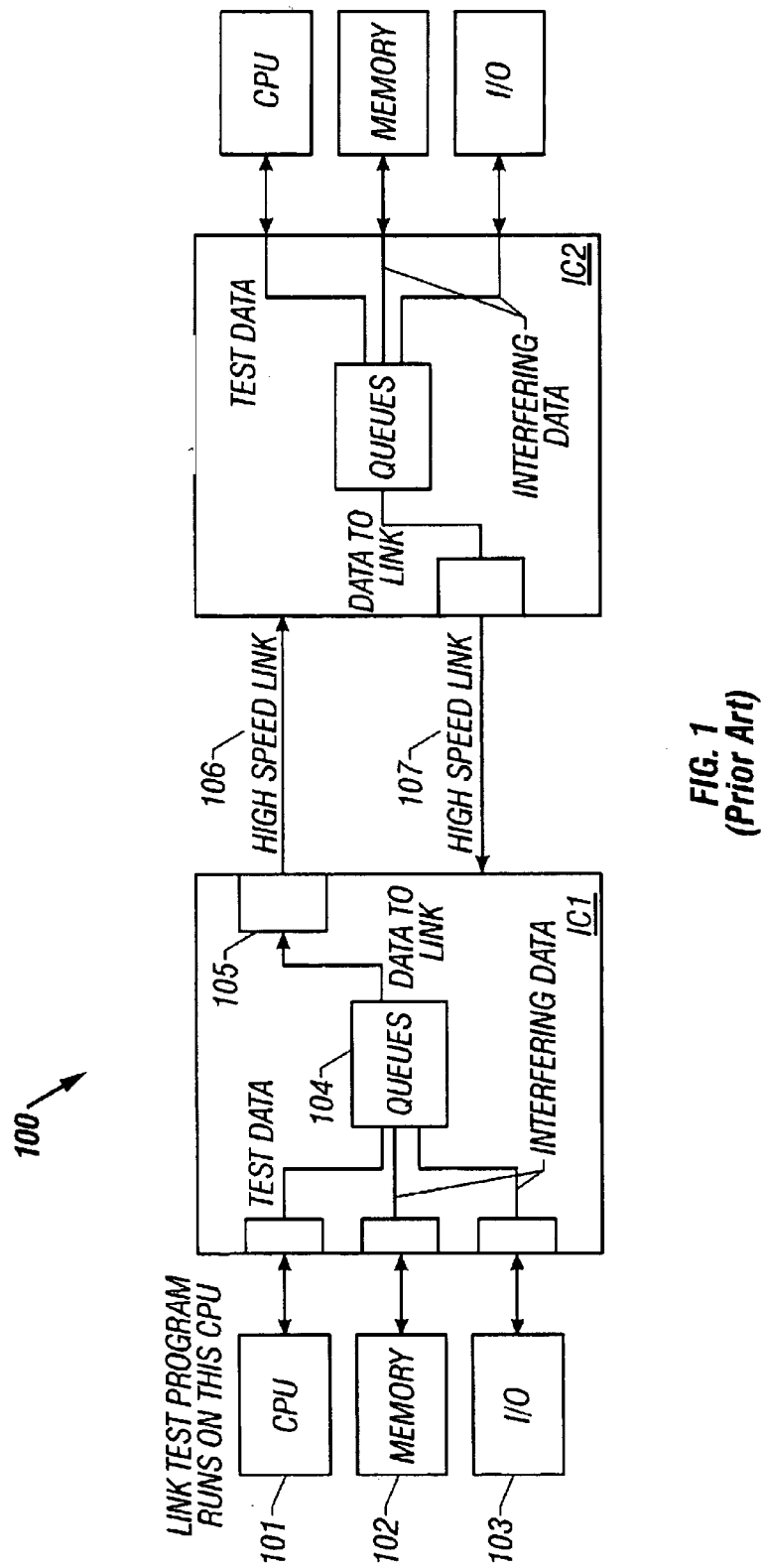
FIG. 1 depicts a block diagram representing an approach to testing a data link according to a prior art solution.
Figure 2:
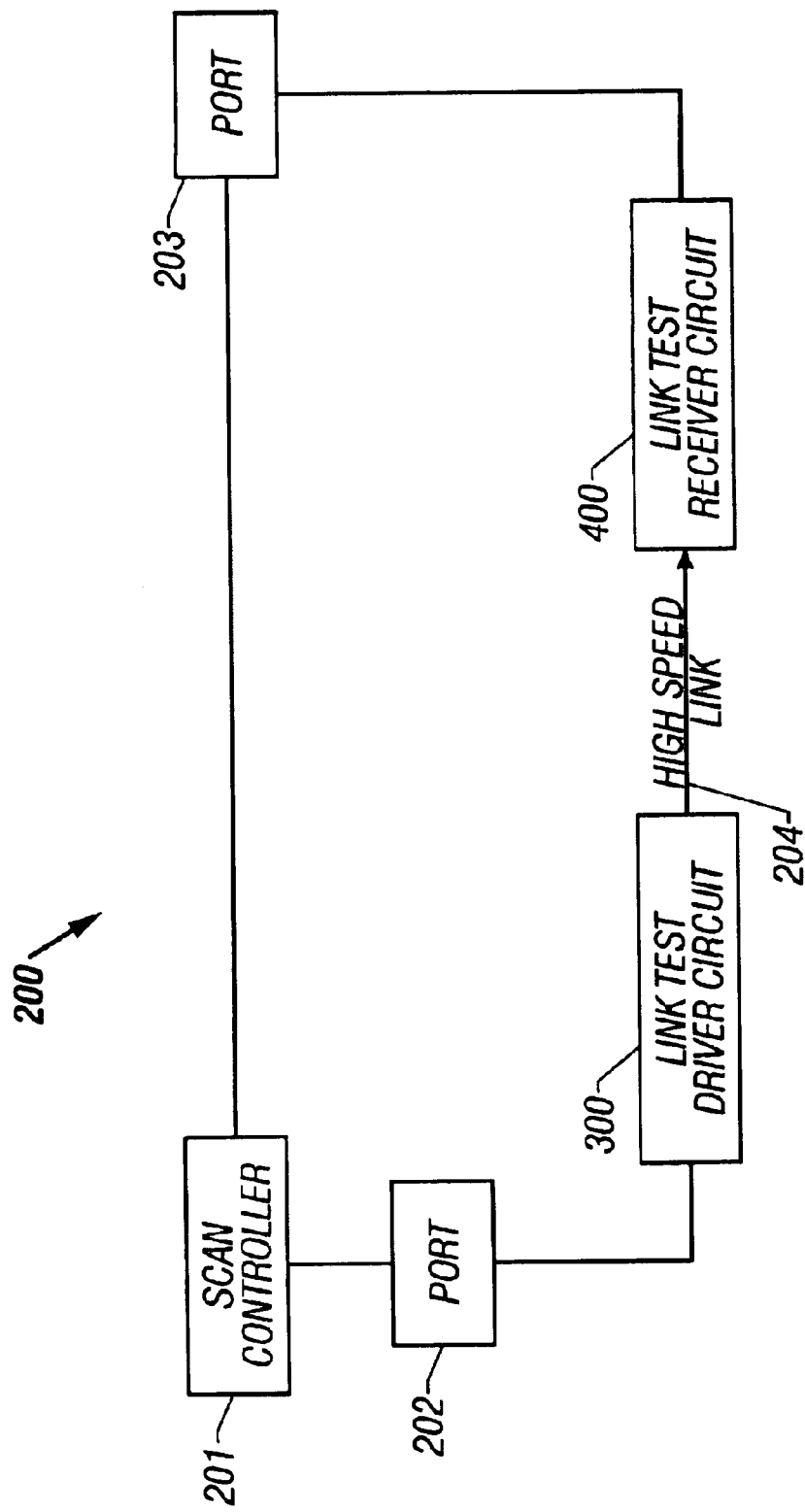
FIG. 2 is a block diagram representing a general overview of link test apparatus according to a preferred embodiment of the present invention.

FIG. 2 is a block diagram representing a general overview of link test apparatus 200 according to a preferred embodiment of the present invention. Preferably, link test driver circuit 300 and link test receiver circuit 400 are disposed within integrated chips, and as shown, are directly coupled to the high speed link 204 across which test pattern data will be transmitted.

In a preferred embodiment, scan controller 201 generates a set of test patterns and transmits them to the link test driver circuit 300 via port 202. The test patterns (or test pattern data) are preferably accumulated in link test driver circuit 300 until ready for high frequency transmission along link 204. Link test receiver circuit 400 then preferably receives the transmitted test pattern data, preferably buffers the data, and then preferably sends the buffered data via port 203 to scan controller 201. Scan controller 201 is then preferably able to compare the test pattern data received from port 203 to the original data provided to link test driver circuit 300. A determination may then be made as to the operational status of link 204. It will be appreciated that a second high speed link (not shown) also preferably exists between the integrated chips housing driver circuit 300 and receiver circuit 400, respectively, which preferably operates in a direction opposite that of link 204.

In an alternative embodiment, test pattern data for transmission across link 204 could be stored in each of the chips housing driver circuit 300 and receiver circuit 400. Employing this approach, the test pattern data (or "patterns") would preferably not have to be scanned into the link test driver circuit, thereby providing substantial time savings. In another alternative embodiment, one or more test patterns could be hard wired in link test driver circuit 300, thereby enabling still more rapid provision of test pattern data which would be available for transmission across link 204, and all such variations are included within the scope of the present invention.

Preferably, the computer chips housing driver circuit 300 and receiver circuit 400 may be located in any portion of a distributed computer system or computing complex. Three common examples of locations of the chips, and by implication, the locations between which a high speed link is being tested are presented below. It will be appreciated that the invention is not limited to testing links between the specific locations identified below. In a first exemplary case, a first chip is located within a computing cell and the second in a back plane which preferably interfaces a plurality of computing cells. In a second exemplary case, the first chip is a cell controller chip and the second chip is an I/O controller chip. In a third exemplary case, the first chip is located in one cabinet within a computing complex and the second chip within a second such cabinet within the same computing complex.

In a preferred embodiment, scan controller 201 may be a general purpose CPU or dedicated controller. Numerous other alternative devices may be used to serve as scan controller 201 and all such variations are included within the scope of the present invention.

Figure 3:
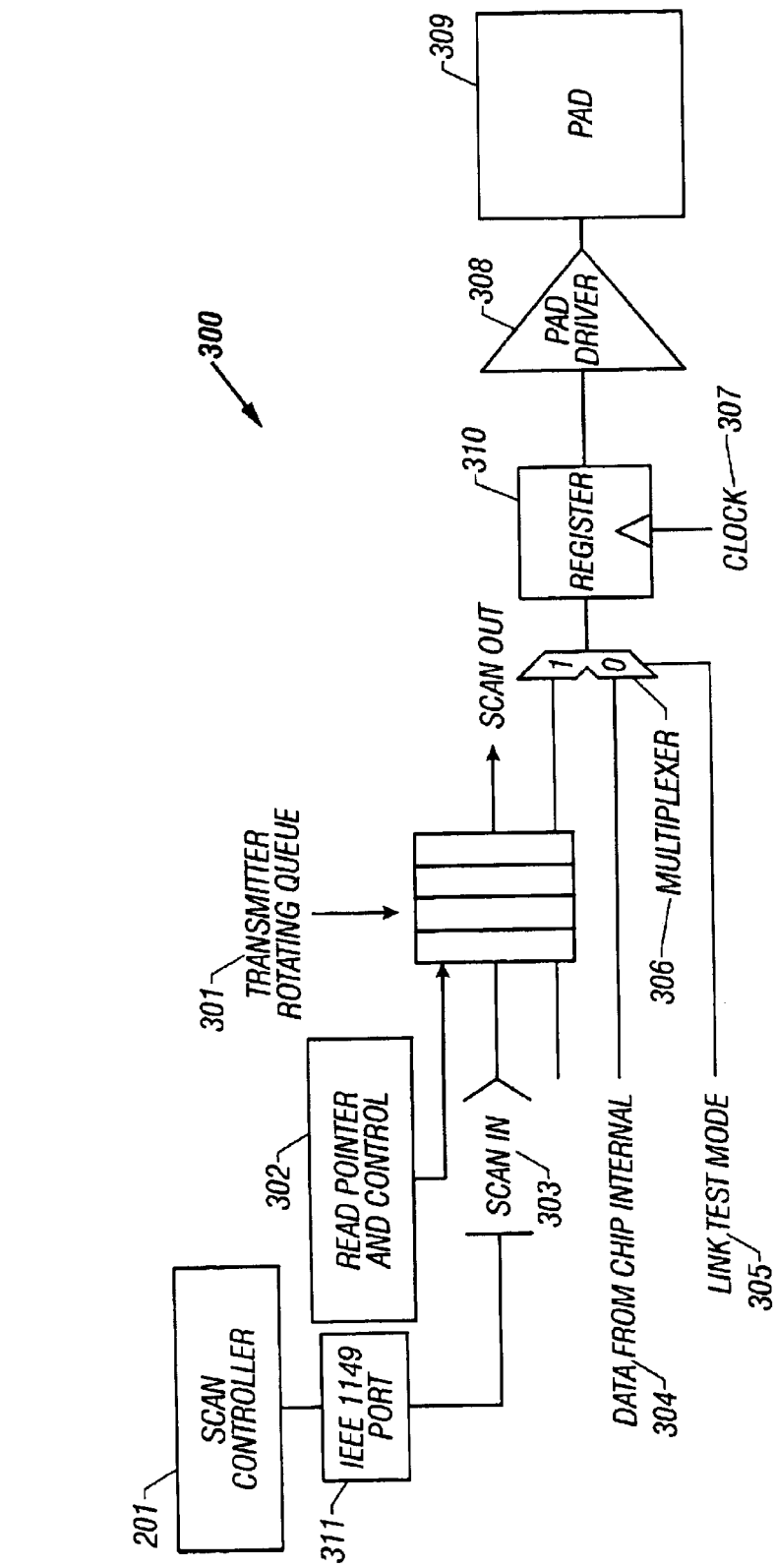
FIG. 3 is diagram of a link test driver circuit according to a preferred embodiment of the present invention.

FIG. 3 is a diagram of link test driver circuit 300 according to a preferred embodiment of the present invention. Since the test circuitry depicted in FIG. 3 employs the same link for testing purposes as is used for communication during normal operating conditions, a mechanism is preferably implemented to select employing the link for normal operation and alternatively, for operation in a test mode. During normal operation of a chip housing link test driver circuit 300, multiplexer 306 is preferably set to the "0" value and "data from chip internal" 304 is transmitted onto the data link (not shown) via pad 309. When the test mode is invoked, multiplexer 306 is preferably set to the "1" value, and test pattern data from transmitter rotating queue 301 is preferably driven onto the data link under test employing pad 309.

In a preferred embodiment, there are two basic phases to accomplishing the communication with test pattern data from the link driver circuit 300 to a corresponding link receiver circuit (FIG. 4) at the other end of the data link being tested. In a first phase, test pattern data is scanned into transmitter rotating queue 301 under the control of scan controller 201. In a second phase, the test pattern data is preferably transmitted out of transmitter rotating queue 301 at a selected link test transmission frequency.

In a preferred embodiment, scan controller 201 transmits test pattern data through port 311, which may be an IEEE 1149 port, to be scanned 303 into transmitter rotating queue 301. Transmitter rotating queue (hereafter "TRQ") 301 preferably operates as a shift register. The scanning process may continue until all patterns or pattern data associated with a particular link test is loaded into TRQ 301. Read pointer and control 302 preferably points to location "0" (the location of the first test data pattern) in preparation for starting the actual test.

In a preferred embodiment, once all the desired test pattern data has been scanned into TRQ 301, the inventive mechanism toggles multiplexer 306 to its "1" state to initiate a link test mode and enable transmission of test pattern data onto the data link. Clock 307 preferably operates to coordinate the transfer data out of TRQ 301 through multiplexer 306 into register 310 and onto pad driver 308. Pad driver 308 preferably drives the test pattern data onto pad 309 for transmission onto the data link under test (not shown). Preferably, pad 309 is a metal contact for interfacing the link driver circuit 300 to external devices. Alternatively, pad 309 may be any suitable conductive interface. Pad driver 308 is preferably custom designed to accommodate the high speed link under test.

In a preferred embodiment, test pattern data may be transmitted into and out of TRQ 301 and stored within TRQ 301 in an number of ways. One approach is for 32 bit patterns to be transmitted into and out of TRQ 301 along 32 bit wide data paths. Alternatively, test pattern data may be scanned in one bit at a time, and all such variations are included in the scope of the present invention. A range of data path widths may be employed to transfer data through TRQ 301, register 310, pad driver 308, pad 309, and the data link under test, and all such variations are included within the scope of the present invention.

Figure 4:
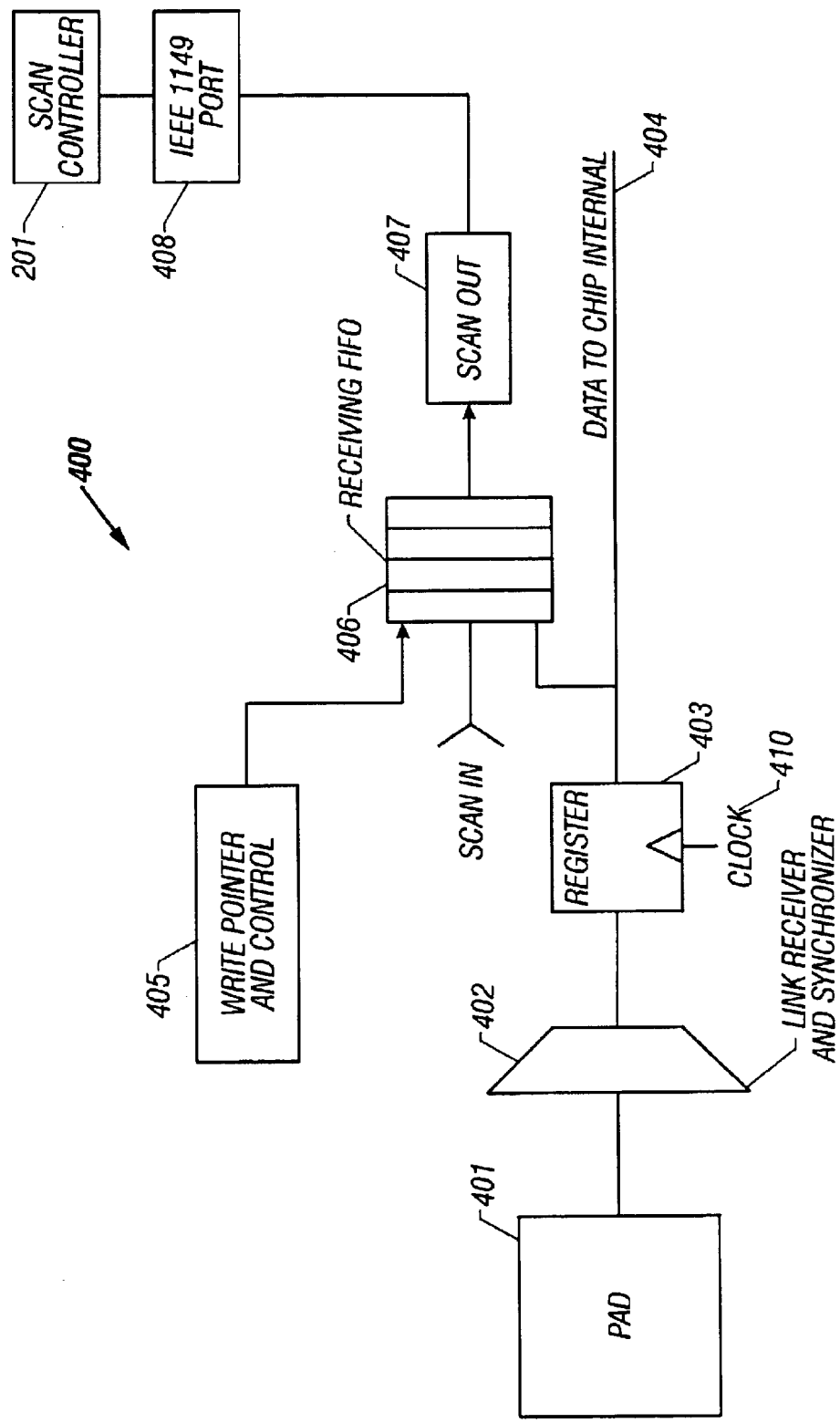
FIG. 4 is a diagram of a link test receiver circuit according to a preferred embodiment of the present invention.

FIG. 4 is a diagram of a link test receiver circuit 400 according to a preferred embodiment of the present invention. Test pattern data preferably arrives from the data link with every clock 410 cycle (not shown) at pad 401 and proceeds to link receiver and synchronizer 402. It will be appreciated that equipment included in link receiver and synchronizer 402 may be selected to accommodate the type of data link over which the data arrives. A range of possible devices could be deployed for link receiver and synchronizer 402 which are preferably custom designed to accommodate the link under test, and all such variations are included within the scope of the present invention.

In a preferred embodiment, incoming test pattern data proceeds into register 403 and then to chip internal 404 which is a normal path by which data proceeds into the chip (housing the link receiver circuit) to be processed. The register 403 and "data to chip internal" 404 path preferably have a data width which matches that of the link (not shown) on which the test pattern data arrives. FIFO (first in, first out buffer) 406 preferably also has a data width or data transmission path which matches that of the data link leading into pad 401.

In a preferred embodiment, receiving FIFO 406 tracks data arriving on the "data to chip internal" line 404 and latches the data on line 404 with each clock 410 cycle. Preferably, write pointer and control 405 points to a next available location in FIFO 406 to which the arriving data is directed. The pointer 405 generally starts off by pointing to location number 0 and advances by one location each time until the last location is reached and then starts over again, thereby overwriting location 0. Data is preferably written to the FIFO 406 until a stop command is received, which command is preferably transmitted from scan controller 201 employing port 408, which may be a IEEE 1149 port.

In a preferred embodiment, data stored in FIFO 406 is scanned out 407 toward port 408 in a manner parallel to the way test pattern data was scanned into TRQ 301 within the link test driver circuit 300. Eventually, all the test pattern data associated with a particular link test is transmitted to scan controller 201 via port 408. Once all the test pattern data has arrived at scan controller 201 from FIFO 406, this "tested" data may be compared with data corresponding to the data originally transmitted to TRQ 301 prior to transmission of data over the link under test. The results of this comparison preferably provide useful information regarding the status of the link under test.

Generally, there is a possibility that the test pattern data stored in receiving FIFO 406 is skewed with respect to the order in which the data was transmitted by the link test driver circuit 300. Specifically, there may be a lack of correspondence between the location of the first data element in TRQ 301 and the same data element in the receiving FIFO 406. Accordingly, software is preferably executed which examines the data after it is scanned out of FIFO 406 via scan controller 201 and which locates the first element of the data, thereby allowing the received data to be properly ordered.

For example, if there are 8 data patterns in TRQ 301, and they are, in order, from head to tail, 1, 2, 3, 4, 5, 6, 7, and 8, then the received data in FIFO 406 could be 2, 3, 4, 5, 6, 7, 8, 1 or some other ordering which maintains the basic sequence but may start the sequence at a different point. In this exemplary case, the software would preferably operate to find "1"in FIFO 406. Upon identifying the location of the "1" pattern (or entry), the software may identify the locations of the remaining patterns.

Figure 5:
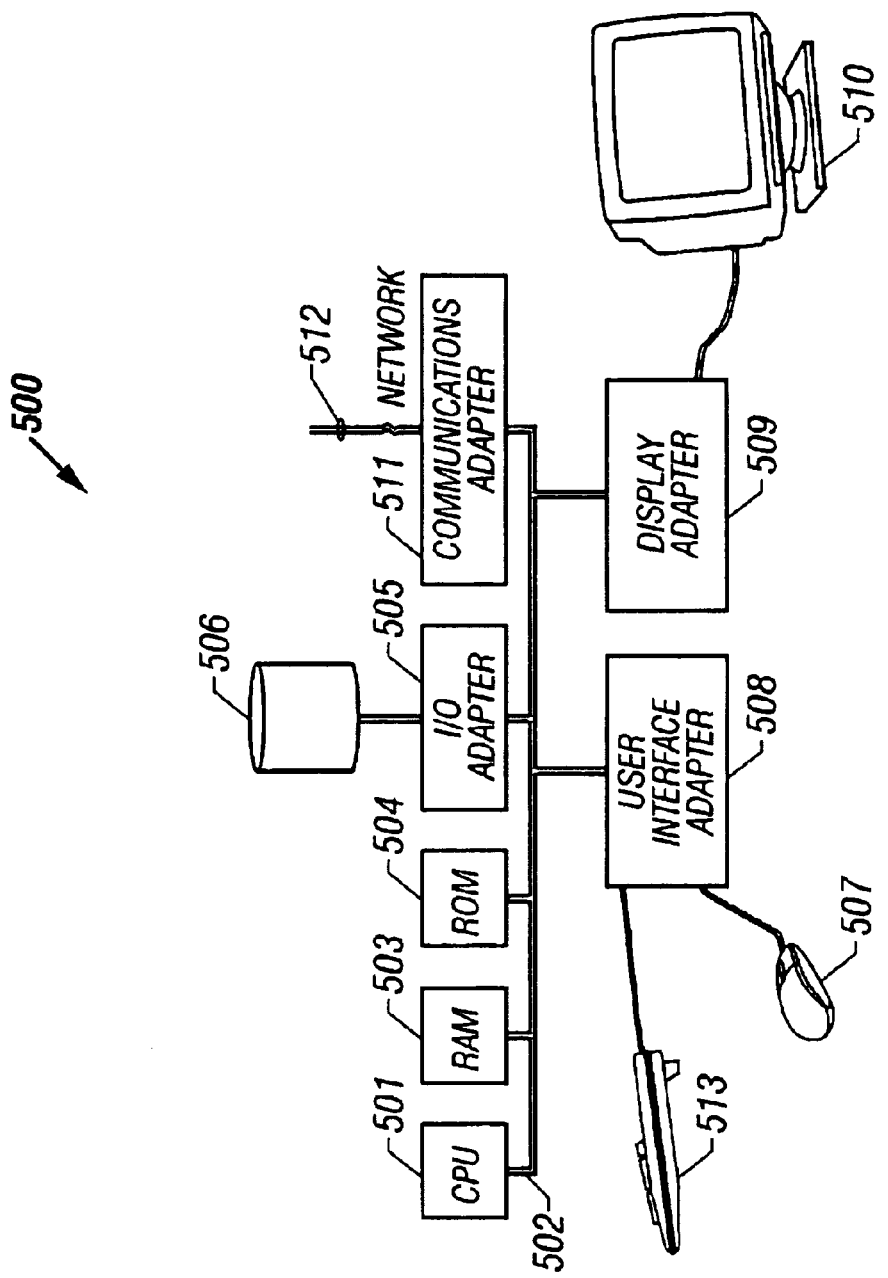
FIG. 5 depicts computer apparatus adaptable for use with a preferred embodiment of the present invention.

FIG. 5 illustrates computer system 500 adaptable for use with a preferred embodiment of the present invention. Central processing unit (CPU) 501 is coupled to system bus 502. The CPU 501 may be any general purpose CPU, such as an HP PA-8200. However, the present invention is not restricted by the architecture of CPU 501 as long as CPU 501 supports the inventive operations as described herein. Bus 502 is coupled to random access memory (RAM) 503, which may be SRAM, DRAM, or SDRAM. ROM 504 is also coupled to bus 502, which may be PROM, EPROM, or EEPROM. RAM 503 and ROM 504 hold user and system data and programs as is well known in the art.

The bus 502 is also coupled to input/output (I/O) adapter 505, communications adapter card 511, user interface adapter 508, and display adapter 509. The I/O adapter 505 connects to storage devices 506, such as one or more of hard drive, CD drive, floppy disk drive, tape drive, to the computer system. Communications adapter 511 is adapted to couple the computer system 500 to a network 512, which may be one or more of local (LAN), wide-area (WAN), Ethernet or Internet network. User interface adapter 508 couples user input devices, such as keyboard 513 and pointing device 507, to the computer system 500. The display adapter 509 is driven by CPU 501 to control the display on display device 510.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for testing a high speed data link, the method comprising the steps of:

preparing a sequence of test patterns;

transmitting substantially only said prepared sequence of test patterns over said high speed data link; and evaluating an integrity of said high speed data link based on said transmitted prepared sequence of test patterns.

2. The method of claim 1 wherein said transmitting step comprises:

transmitting only said prepared sequence of test patterns.

3. The method of claim 1 wherein said transmitting step comprises:

employing hardware to conduct said transmitting step, thereby effecting rapid communication of said prepared sequence of test patterns over said high speed data link.

4. The method of claim 1 wherein said preparing step comprises:

scanning said test patterns into a shift register.

5. The method of claim 1 wherein said preparing step comprises:

storing said test patterns in an integrated chip coupled to said high speed data link.

6. The method of claim 1 wherein said preparing step comprises:

hard wiring said test patterns into an integrated chip coupled to said high speed data link.

7. The method of claim 1 further comprising the step of:

placing said high speed data link in a test mode prior to said transmitting step.

8. The method of claim 1 further comprising the step of:

receiving said transmitted test patterns at a receiving end of said high speed data link.

9. The method of claim 1 wherein the evaluating step of comprises the step of:

comparing said transmitted prepared data patterns with said prepared data patterns.

10. The method of claim 1 further comprising the steps of:

employing said high speed data link for normal communication of an integrated chip conducting said transmitting step; and switching said chip into a diagnostic mode prior to said transmitting step.

11. Apparatus for testing a data link, the apparatus comprising:

test pattern data available for transmission over said data link;

a driver for causing said test pattern data to be transmitted over said data link; and a switch coupled to said driver for disabling transmission of data other than said test pattern data over said data link, thereby enabling transmission of undisturbed test pattern data over said link.

12. The apparatus of claim 11 further comprising:

a shift register for storing said test pattern data.

13. The apparatus of claim 12 further comprising:

a scan controller for loading test pattern data into said shift register.

14. The apparatus of claim 11 wherein said switch is a multiplexer.

15. The apparatus of claim 11 further comprising:

a synchronizer for receiving said test pattern data into a chip at a receiving end of said data link.

16. The apparatus of claim 15 further comprising:

a receiving FIFO for storing said received test pattern data in said receiving chip.

17. A system for testing a communication link, the system comprising:

means for preparing test pattern data for transmission over said communication link;

means for transmitting said prepared test pattern data over said communication link; and means for excluding data other than said test pattern data from transmission over said link during said testing of said communication link.

18. The system of claim 17 further comprising:

clock means for synchronizing said means for transmitting said prepared test pattern data.

19. The system of claim 17 wherein said preparing means comprises:

means for permanently storing said test pattern data in a chip at a transmitting end of said communication link.

20. The system of claim 17 further comprising:

means for receiving said transmitted test pattern data; and means for evaluating said communication link based on said received transmitted test pattern data and said prepared test pattern data.

* * * * *